(12) United States Patent
Chang

(10) Patent No.: US 12,095,359 B2
(45) Date of Patent: Sep. 17, 2024

(54) POWER FACTOR CORRECTION CONVERTER, CONTROLLER AND DIGITAL PEAK-HOLD CIRCUIT THEREOF

(71) Applicant: Richtek Technology Corporation, Zhubei (TW)

(72) Inventor: Wei-Hsu Chang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 197 days.

(21) Appl. No.: 17/937,337

(22) Filed: Sep. 30, 2022

(65) Prior Publication Data

US 2023/0144791 A1     May 11, 2023

Related U.S. Application Data

(60) Provisional application No. 63/277,024, filed on Nov. 8, 2021.

(30) Foreign Application Priority Data

Jun. 10, 2022 (TW) .................................. 111121754

(51) Int. Cl.
*H02M 1/42* (2007.01)
*H02M 7/04* (2006.01)
*H03K 5/1532* (2006.01)
*H03M 1/12* (2006.01)

(52) U.S. Cl.
CPC ........... *H02M 1/4258* (2013.01); *H02M 7/04* (2013.01); *H03K 5/1532* (2013.01); *H03M 1/12* (2013.01)

(58) Field of Classification Search
CPC .... H02M 1/4258; H02M 7/04; H03K 5/1532; H03M 1/12
See application file for complete search history.

(56) References Cited

U.S. PATENT DOCUMENTS

| | | | |
|---|---|---|---|
| 10,554,200 B2* | 2/2020 | Franke | .................... H02M 1/32 |
| 11,632,039 B2* | 4/2023 | Endo | ................... H02M 7/2176 363/89 |
| 2015/0303790 A1* | 10/2015 | Lin | ..................... H02M 1/4225 363/89 |
| 2024/0146184 A1* | 5/2024 | Yamada | .............. H02M 3/1586 |

* cited by examiner

*Primary Examiner* — Adolf D Berhane
(74) *Attorney, Agent, or Firm* — Tung & Associates

(57) ABSTRACT

A power factor correction converter includes a rectifier, a power factor correction controller, a power stage circuit, and a feedback circuit, wherein the power factor correction converter converts an AC voltage into an output voltage. The power factor correction controller includes an analog-to-digital converter, a digital peak-hold circuit, a reference voltage generator, an error amplifier, and a pulse-width modulation circuit, wherein the power factor correction controller generates a driving signal according to a rectification signal and a feedback signal. The digital peak-hold circuit includes a delay circuit, a digital rising detector, a tracking register, a digital falling detector, and a holding register, wherein the digital peak-hold circuit generates a peak signal according to a digital input signal.

19 Claims, 17 Drawing Sheets

POWER FACTOR CORRECTION CONVERTER, CONTROLLER AND DIGITAL PEAK-HOLD CIRCUIT THEREOF

CROSS REFERENCE

The present invention claims priority to U.S. 63/277,024 filed on Nov. 8, 2021 and claims priority to TW 111121754 filed on Jun. 10, 2022.

BACKGROUND OF THE INVENTION

Field of Invention

The present invention relates to a converter, and in particular to a power factor correction converter. The present invention also relates to a power factor correction controller and a digital peak-hold circuit suitable for use in a power factor correction converter.

Description of Related Art

A power factor correction converter (PFC converter) is a circuit which is often used in a power supply to reduce power loss which is relevant to power factor (PF). Power factor is defined as a ratio of actual power to apparent power, wherein actual power is the power actually consumed by a load coupled to a power source (such as a power supply), and apparent power is a total power that the power source needs to provide. Generally, the power factor ranges from 0 to 1, wherein when the value of the power factor is less than 1, it means that the voltage and current provided by the power supply are out of phase, thereby causing the problem of power loss, and when the value of the power factor is closer to 0, the problem of power loss is more serious.

Please refer to FIG. 1A. FIG. 1A is a module block diagram of a power factor correction converter 10 of a conventional art. As shown in FIG. 1A, the power factor correction converter 10 of the conventional art includes a rectifier 101, a power factor correction controller 102, and a power stage circuit 103, wherein the power factor correction converter 10 is configured to convert an alternating current (AC) voltage Vac into an output voltage Vo in a same phase, and the value of its power factor is close to 1, to control the power loss to minimum.

Although the power factor correction converter 10 of the conventional art can improve the power loss problem, it still has problems of circuit size, cost, and larger overall power consumption during operation. Please refer to FIG. 1B, which is a waveform comparison diagram between a rectified voltage Vi and the output voltage Vo in the power factor correction converter 10 of the conventional art. Please refer to FIG. 1B, the waveform W1 is a waveform of the output voltage Vo, and the waveform W2 is a waveform of the rectified voltage Vi, wherein the value of the output voltage Vo is a constant value (for example, 400 volts), and the rectified voltage Vi is generated by rectifying the AC voltage Vac through the rectifier 101. As shown by the dotted square Sq1 in FIG. 1B, when a peak of the rectified voltage Vi is relatively low (for example, 85 volts), the power factor correction converter 10 of the conventional art still converts it into the output voltage Vo of a larger constant value (400 volts). Since the voltage difference between the peak of the rectified voltage Vi and the output voltage Vo is relatively large (for example, 315 volts), the power factor correction converter 10 of the conventional art must use a large-sized energy storage device (for example, a capacitor or an inductor) and switches (for example, diodes or transistors) to avoid circuit damages. Consequently, the cost and the overall power consumption during operation of the power factor correction converter 10 of the conventional art are relatively large.

In view of this, the present invention proposes a power factor correction controller and a digital peak-hold circuit suitable for use in a power factor correction converter, wherein the value of the output voltage Vo is changed with the peak of the rectified voltage Vi to reduce the voltage difference in between, thereby reducing the circuit size, cost, and overall power consumption of the power factor correction converter during operation.

SUMMARY OF THE INVENTION

From one perspective, the present invention provides a digital peak-hold circuit configured to generate a peak signal according to a digital input signal, comprising: a delay circuit, configured to delay the digital input signal to generate a delayed input signal, wherein the delayed input signal is delayed by at least one clock period of the digital input signal; a digital rising detector, configured to compare the digital input signal and the delayed input signal to generate a rising signal, wherein when the digital input signal is greater than the delayed input signal, the digital rising detector controls the rising signal to be in a first enabled state; a tracking register, configured to latch a value of the digital input signal to generate a tracking signal when the rising signal is in the first enabled state; a digital falling detector, configured to compare the digital input signal and the delayed input signal to generate a falling signal, wherein when the digital input signal is less than the delayed input signal, the digital falling detector controls the falling signal to be in a second enabled state; and a holding register, configured to latch a value of the tracking signal to generate the peak signal when the falling signal is switched to the second enabled state.

In one embodiment, when the tracking register receives a reset signal, the tracking register sets the tracking signal to a reset value, wherein an initial value of the tracking signal is the reset value; and/or when the holding register receives another reset signal, the holding register sets the peak signal to another reset value, wherein an initial value of the peak signal is the another reset value.

In one embodiment, the digital peak-hold circuit further includes a holding signal generator configured to generate a holding signal, the holding signal generator being configured to trigger a pulse of the holding signal when the falling signal is switched to the second enabled state, wherein the holding register latches the value of the tracking signal to generate the peak signal when the pulse is triggered.

In one embodiment, the digital peak-hold circuit further includes a digital filter configured to mask or filter a noise of the digital input signal, so that the value of the digital input signal monotonically increases or monotonically decreases within ½ period or ¼ period of the digital input signal.

In one embodiment, the digital peak-hold circuit suitable for a power factor correction converter, wherein the power factor correction converter comprises: a rectifier, configured to rectify an alternating current voltage to generate a rectified voltage; a power stage circuit, comprising at least one switch and an inductor, configured to convert the rectified voltage into an output voltage through a switched inductor conversion method; a feedback circuit, configured to generate a feedback signal according to the output voltage; an analog-to-digital converter, configured to convert a rectified signal into the digital input signal, wherein the rectified signal is relevant to the rectified voltage; a reference voltage generator, configured to generate a reference voltage according to the peak signal; an error amplifier, configured to generate an error amplified signal according to a difference between the feedback signal and the reference voltage; and a pulse-width modulation circuit, configured to perform pulse-width modulation on the error amplified signal to generate a driving signal, wherein the driving signal is configured to control the at least one switch.

In one embodiment, the rectified signal has a full-wave rectification form or a half-wave rectification form.

In one embodiment, a mapping relationship which is linear or piecewise linear is set between the reference voltage and the peak signal, such that the output voltage and a value of the rectified voltage corresponding to the peak signal have another mapping relationship in between and the another mapping relationship is correspondingly linear or correspondingly piecewise linear, wherein the output voltage is always greater than the value of the rectified voltage corresponding to the peak signal.

In one embodiment, the reference voltage generator comprises: a look-up table, configured to generate a mapping output signal by mapping the peak signal according to the mapping relationship; and a digital-to-analog converter, configured to convert the mapping output signal into the reference voltage, wherein the mapping output signal is a digital signal and the reference voltage is an analog signal.

In one embodiment, the look-up table comprises a read only memory (ROM), a random access memory (RAM), a flash memory (Flash), or a combination thereof.

From another perspective, the present invention provides a power factor correction controller, suitable for a power factor correction converter, configured to generate a driving signal according to a rectified signal and a feedback signal, comprising: an analog-to-digital converter, configured to convert a rectified signal into a digital input signal; a digital peak-hold circuit, configured to generate a peak signal according to the digital input signal, the digital peak-hold circuit comprising: a delay circuit, configured to delay the digital input signal to generate a delayed input signal, wherein the delayed input signal is delayed by at least one clock period of the digital input signal; a digital rising detector, configured to compare the digital input signal and the delayed input signal to generate a rising signal, wherein when the digital input signal is greater than the delayed input signal, the digital rising detector controls the rising signal to be in a first enabled state; a tracking register, configured to latch a value of the digital input signal to generate a tracking signal when the rising signal is switched to the first enabled state; a digital falling detector, configured to compare the digital input signal and the delayed input signal to generate a falling signal, wherein when the digital input signal is less than the delayed input signal, the digital falling detector controls the falling signal to be in a second enabled state; a holding register, configured to latch a value of the tracking signal to generate the peak signal when the falling signal is switched to the second enabled state; a reference voltage generator, configured to generate a reference voltage according to the peak signal; an error amplifier, configured to generate an error amplified signal according to a difference between the feedback signal and the reference voltage; and a pulse-width modulation circuit, configured to perform pulse-width modulation on the error amplified signal to generate a driving signal, wherein the driving signal is configured to control at least one switch.

From another perspective, the present invention provides a power factor correction converter, configured to convert an alternating current voltage into an output voltage, comprising: a rectifier, configured to rectify an alternating current voltage to generate a rectified voltage; a power factor correction controller, configured to generate a driving signal according to a rectified signal and a feedback signal, wherein the rectified signal is relevant to the rectified voltage, and the power factor correction controller comprises: an analog-to-digital converter, configured to convert the rectified signal into a digital input signal; a digital peak-hold circuit, configured to generate a peak signal according to the digital input signal, the digital peak-hold circuit comprising: a delay circuit, configured to delay the digital input signal to generate a delayed input signal, wherein the delayed input signal is delayed by at least one clock period of the digital input signal; a digital rising detector, configured to compare the digital input signal and the delayed input signal to generate a rising signal, wherein when the digital input signal is greater than the delayed input signal, the digital rising detector controls the rising signal to be in a first enabled state; a tracking register, configured to latch a value of the digital input signal to generate a tracking signal when the rising signal is in the first enabled state; a digital falling detector, configured to compare the digital input signal and the delayed input signal to generate a falling signal, wherein when the digital input signal is less than the delayed input signal, the digital falling detector controls the falling signal to be in a second enabled state; a holding register, configured to latch a value of the tracking signal to generate the peak signal when the falling signal is switched to the second enabled state; a reference voltage generator, configured to generate a reference voltage according to the peak signal; an error amplifier, configured to generate an error amplified signal according to a difference between the feedback signal and the reference voltage; and a pulse-width modulation circuit, configured to perform pulse-width modulation on the error amplified signal to generate a driving signal, wherein the driving signal is configured to control the switch; a power stage circuit, comprising at least one switch and an inductor, configured to convert the rectified voltage into the output voltage through a switched inductor conversion method; and a feedback circuit, configured to generate the feedback signal according to the output voltage.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
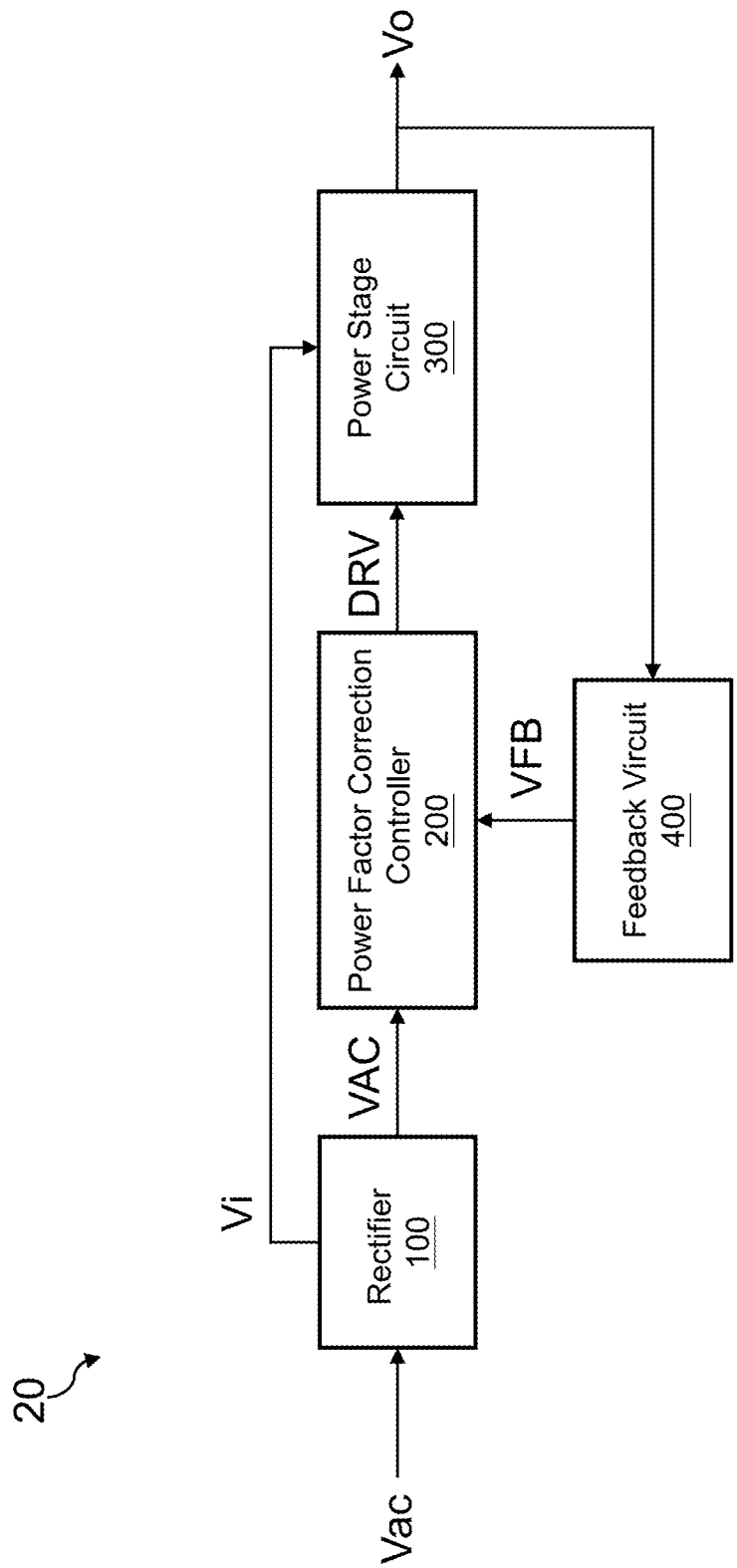
FIG. 2 is a module block diagram of a power factor correction converter according to an embodiment of the present invention.

Please refer to FIG. 2, which is a module block diagram of a power factor correction converter 20 according to an embodiment of the present invention. As shown in FIG. 2, the power factor correction converter 20 includes a rectifier 100, a power factor correction controller 200, a power stage circuit 300, and a feedback circuit 400, wherein the power factor correction controller 200 is coupled to the rectifier 100, the power stage circuit 300 and the feedback circuit 400, and the power stage circuit 300 is coupled to the rectifier 100 and the feedback circuit 400. The structures and functions of the rectifier 100, the power factor correction controller 200, the power stage circuit 300, and the feedback circuit 400 and how they operate will be explained in detail below.

In some embodiments, the rectifier 100 is configured to rectify an alternating current (AC) voltage Vac into a rectified voltage Vi, wherein the rectified voltage Vi is a half-wave signal or a full-wave signal. When the rectified voltage Vi is the half-wave signal, it means that the rectifier 100 eliminates the negative voltage part in the AC voltage Vac, and rectifies the AC voltage Vac into the rectified voltage Vi with a half-wave form. When the rectified voltage Vi is the full-wave signal, it means that the rectifier 100 converts the negative voltage part in the AC voltage Vac into a positive voltage, and rectifies the AC voltage Vac into the rectified voltage with a full-wave form. The structure and function of the rectifier are well known to those with ordinary knowledge in the technical field to which the present invention pertains, and thus are not redundantly explained in detail herein.

In some embodiments, the power factor correction controller 200 is configured to generate a driving signal DRV according to a rectified signal VAC and a feedback signal VFB, wherein the rectified signal VAC is relevant to the rectified voltage Vi. In some embodiments, the rectified signal VAC is a half-wave signal or a full-wave signal, wherein the rectified signal VAC may or may not be equal to the rectified voltage Vi. In other words, when the rectified voltage Vi is a half-wave signal, the rectified signal VAC is the half-wave signal or a full-wave signal, and when the rectified voltage Vi is a full-wave signal, the rectified signal VAC is a half-wave signal or the full wave signal.

Figure 3:
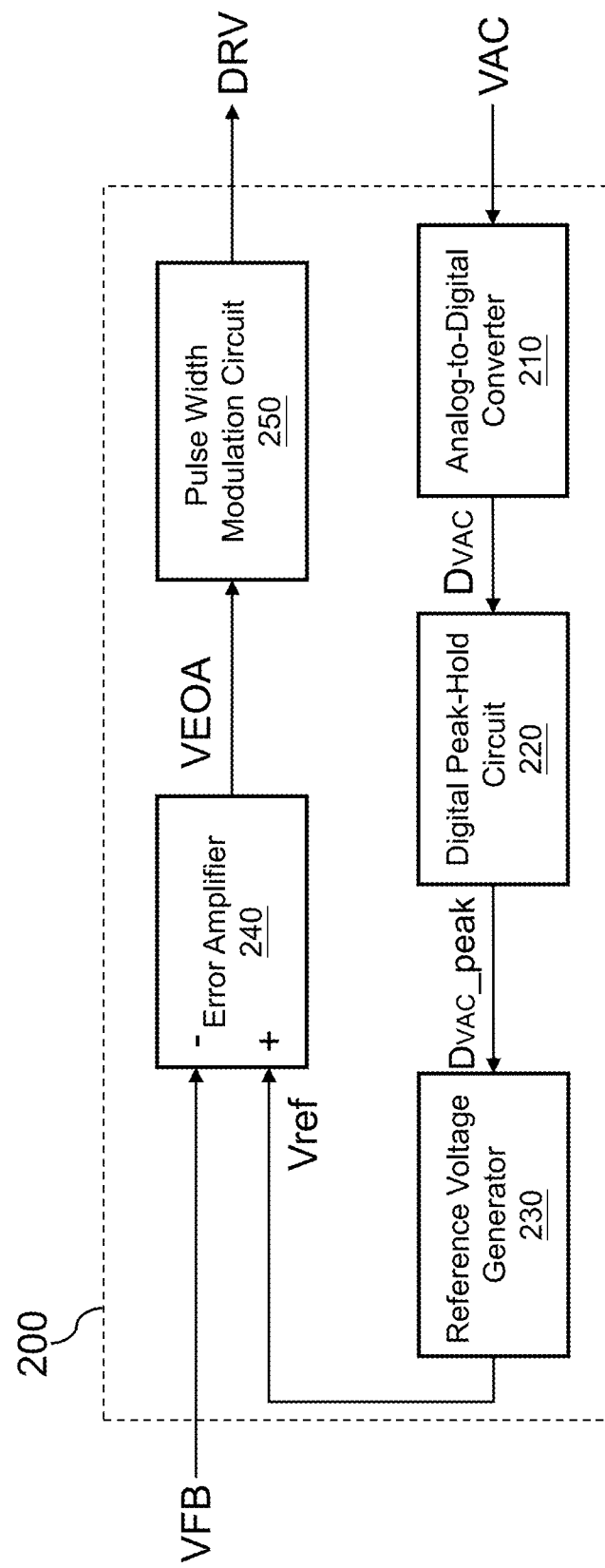
FIG. 3 is a module block diagram of the power factor correction controller according to an embodiment of the present invention.

Please refer to FIG. 3, which is a schematic circuit diagram of the power factor correction controller 200 according to an embodiment of the present invention. As shown in FIG. 3, in some embodiments, the power factor correction controller 200 includes an analog-to-digital converter 210, a digital peak-hold circuit 220, a reference voltage generator 230, an error amplifier 240, and a pulse-width modulation circuit 250, wherein the analog-to-digital converter 210 is coupled to the digital peak-hold circuit 220; the digital peak-hold circuit 220 is coupled to the reference voltage generator 230; the reference voltage generator 230 is coupled to the error amplifier 240; and the error amplifier 240 is coupled to the pulse-width modulation circuit 250. The structures and functions of the analog-to-digital converter 210, the digital peak-hold circuit 220, the reference voltage generator 230, the error amplifier 240, and the pulse-width modulation circuit 250 and how they operate will be explained in detail below.

Figure 4:
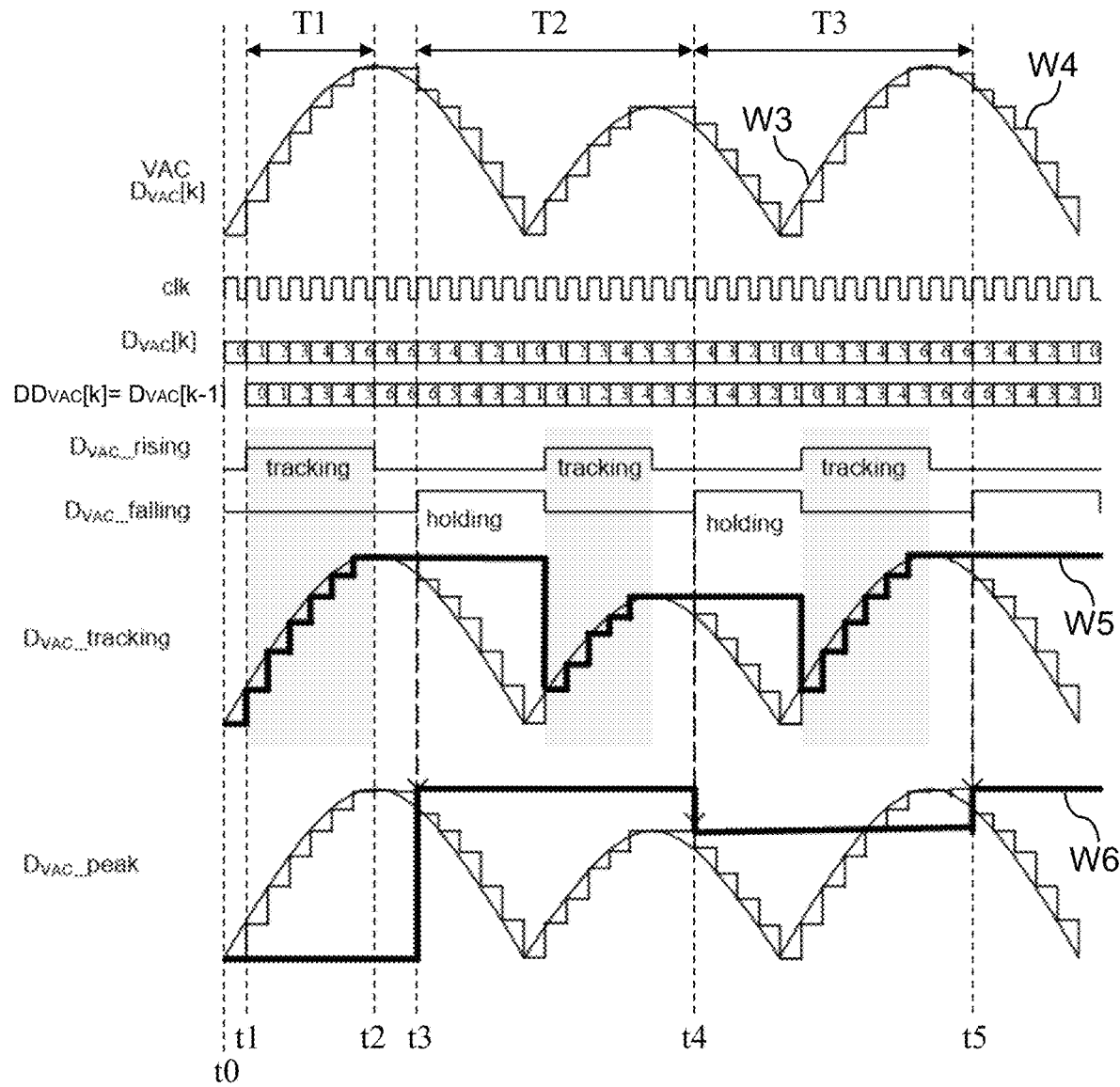
FIG. 4 is a waveform diagram of input/output voltages of devices in the power factor correction controller as a function of time according to an embodiment of the present invention.

Please refer to FIG. 4. FIG. 4 is a waveform diagram of input/output voltages of devices in the power factor correction controller 200 as a function of time according to an embodiment of the present invention. As shown in FIG. 4, in some embodiments, the analog-to-digital converter 210 is configured to convert the rectified signal VAC (corresponding to waveform W3) into a digital input signal DVAC (corresponding to waveform W4), wherein the digital input signal DVAC is a continuous stepwise waveform, and the digital input signal DVAC continuously updates its value according to a clock frequency. As shown in clock clk and waveform W4 of FIG. 4, the value of the digital input signal DVAC is updated once for every clock period. The structure and function of the analog-to-digital converter are well known to those with ordinary knowledge in the technical field to which the present invention pertains, and thus are not redundantly explained in detail herein.

Figure 5A:
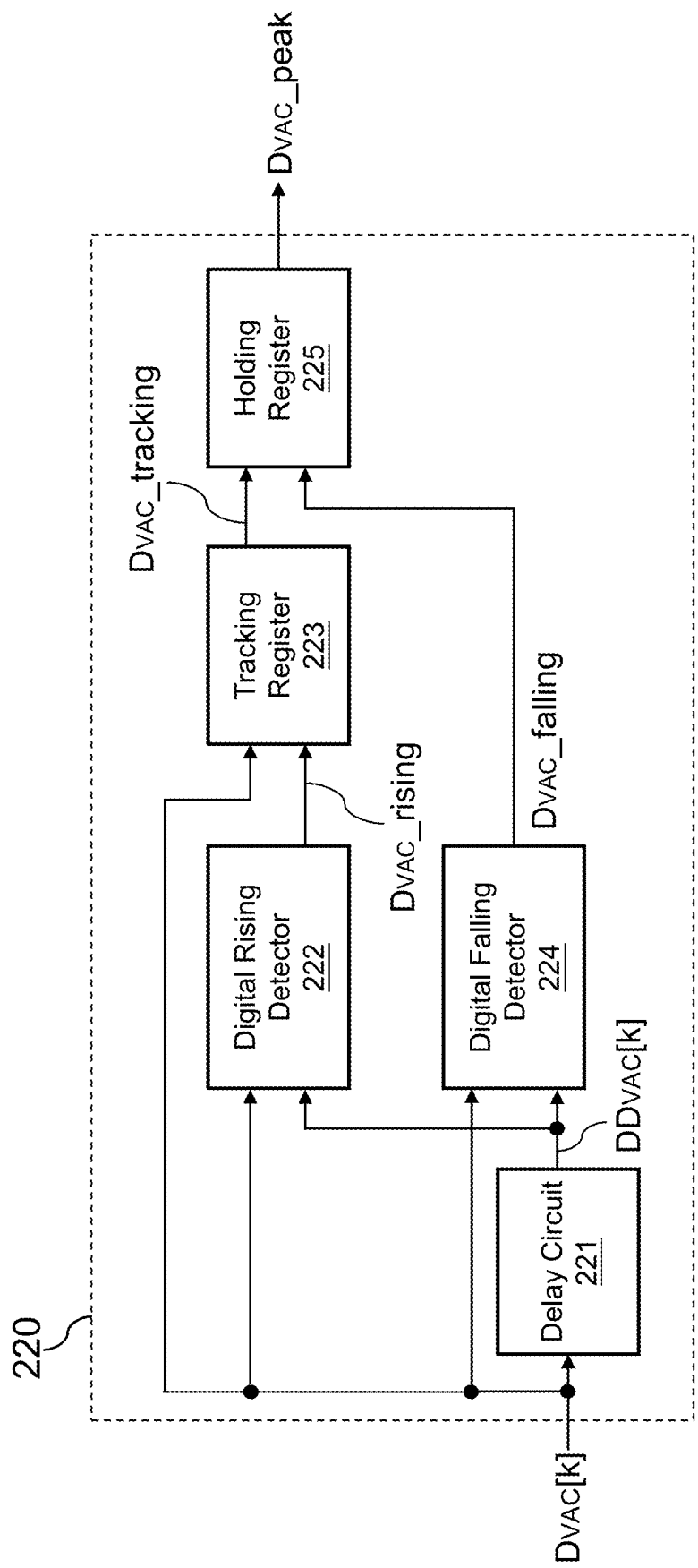
FIG. 5A is a module block diagram of a digital peak-hold circuit according to an embodiment of the present invention.

In some embodiments, the digital peak-hold circuit 220 is configured to generate a peak signal DVAC_peak according to the digital input signal DVAC. Please refer to FIG. 5A, which is a module block diagram of the digital peak-hold circuit 220 according to an embodiment of the present invention. As shown in FIG. 5A, the digital peak-hold circuit 220 includes a delay circuit 221, a digital rising detector 222, a tracking register 223, a digital falling detector 224 and a holding register 225, wherein the delay circuit 221 is coupled to the digital rising detector 222, the tracking register 223 and the digital falling detector 224; the digital rising detector 222 is coupled to the tracking register 223; the tracking register 223 is coupled to the holding register 225; and the digital falling detector 224 is coupled to the holding register 225. The structures and functions of the delay circuit 221, the digital rising detector 222, the tracking register 223, the digital falling detector 224, and the holding register 225 and how they operate will be explained in detail below.

In some embodiments, the delay circuit 221 is configured to delay the digital input signal DVAC to generate a delayed input signal DDVAC, wherein the delayed input signal DDVAC is delayed by at least one clock period of the digital input signal DVAC. As shown in FIG. 4, according to the present embodiment, the delayed input signal DDVAC is delayed by one clock period from the digital input signal DVAC; therefore, the value DDVAC[k] of the delayed input signal DDVAC in a kth clock period is equal to the value DVAC[k−1] of the digital input signal DVAC in the previous clock period, that is, the (k−1)th clock period, wherein k is a count number of the clock period, and k−1 represents the previous clock period of the kth clock period. Taking the first clock period (time point t1) and waveform W4 in FIG. 4 as an example, the value DVAC[1] of the digital input signal DVAC in the first clock period (time point t1) is 1, and the value DVAC[0] of the digital input signal DVAC in the previous clock period, that is, the 0th clock period (time point t0), is 0. Therefore, the value DDVAC[1] of the delayed input signal DDVAC in the first clock period (time point t1) is equal to 0. It should be noted that the delay of the delayed input signal DDVAC from the digital input signal DVAC is not limited to one clock period; it may be two clock periods, three clock periods, or other multiple clock periods.

In some embodiments, the digital rising detector 222 is configured to compare the digital input signal DVAC and the delayed input signal DDVAC to generate a rising signal DVAC_rising, wherein when the value DVAC[k] of the digital input signal DVAC in the kth clock period is greater than the value DDVAC[k] of the delayed input signal DDVAC in the kth clock period, the rising signal DVAC_rising is switched to an enabled state. Taking the time point t1 in FIG. 4 as an example, the value DVAC[1] of the digital input signal in the first clock period (time point t1) is 1 and the value DDVAC[1] of the delayed input signal DDVAC in the first clock period (time point t1) is 0, meanwhile, the value DVAC[1] of the digital input signal in the kth clock period is greater than the value DDVAC[1] of the delayed input signal DDVAC in the kth clock period, so the rising signal DVAC_rising is switched to the enabled state, wherein the enabled state is high level in this embodiment.

In some embodiments, the tracking register 223 is configured to latch the value of the digital input signal DVAC when the rising signal DVAC_rising is in the enabled state, so as to generate a tracking signal DVAC_tracking (corresponding to waveform W5). As shown in the waveforms W4 and W5 of FIG. 4, when the rising signal DVAC_rising is in the enabled state, the tracking register 223 latches the value of the digital input signal DVAC to generate the tracking signal DVAC_tracking. Therefore, in the period T1, the waveform W4 is identical to the waveform W5. In some embodiments, when the tracking register 223 receives a reset signal, the tracking register 223 sets the tracking signal DVAC_tracking to a reset value, wherein an initial value of the tracking signal DVAC_tracking is the reset value. In other words, the tracking register 223 has a reset function, so that the tracking register 223 can set the tracking signal DVAC_tracking to the reset value. In some embodiments, the reset value is a disabled state (i.e., low level).

In some embodiments, the digital falling detector 224 is configured to compare the digital input signal DVAC and the delayed input signal DDVAC to generate a falling signal DVAC_falling, wherein when the value DVAC[k] of the digital input signal DVAC in the kth clock period (for example, time point t3) is less than the value DDVAC[k] of the delayed input signal DDVAC in the kth clock period (time point t3), the falling signal DVAC_falling is switched to an enabled state, wherein the enabled state is high level in this embodiment, but can be defined differently. Taking the time point t3 in FIG. 4 as an example, the time point t3 is a time point when the digital input signal DVAC first falls after rising. At this moment, the value DVAC[k] of the digital input signal DVAC at the time point t3 is 5 and the value DDVAC[k] of the delayed input signal DDVAC at the time point t3 is 6. Since the value DVAC[k] of the digital input signal at the time point t3 is less than the value DDVAC[k] of the delayed input signal DDVAC at the time point t3, the falling signal DVAC_falling is switched to the enabled state.

In some embodiments, the holding register 225 is configured to latch the value of the tracking signal DVAC_tracking to generate the peak signal DVAC_peak (corresponding to waveform W6) when the falling signal DVAC_falling is switched to the enabled state. As shown in the waveforms W5 and W6 of FIG. 4, when the falling signal DVAC_falling is switched to the enabled state (for example, time point t3, time point t4, and time point t5), the holding register 225 will latch the value of the tracking signal DVAC_tracking to generate the peak signal DVAC_peak. Taking the time point t3 as an example, when the falling signal DVAC_falling is switched to the enabled state at the time point t3, the holding register 225 will generate the peak signal DVAC_peak, wherein the value of the peak signal DVAC_peak is equal to the value of the tracking signal DVAC_tracking at the time point t3. Therefore, in the period T2, the value of the peak signal DVAC_peak is latched and held at the value of the tracking signal DVAC_tracking at the time point t3. Also, taking the time point t4 as an example, when the falling signal DVAC_falling is switched to the enabled state, the holding register 225 will generate the peak signal DVAC_peak, wherein the value of the peak signal DVAC_peak is equal to the value of the tracking signal DVAC_tracking at the time point t4; therefore in the period T3, the value of the peak signal DVAC_peak is latched and held at the value of the tracking signal DVAC_tracking at the time point t4.

In some embodiments, when the holding register 225 receives another reset signal, the holding register 225 sets the peak signal DVAC_peak to another reset value, wherein the initial value of the peak signal DVAC_peak is said another reset value. In other words, the holding register 225 has a reset function, so that the holding register 225 can set the peak signal DVAC_peak to the another reset value. In some embodiments, the another reset value is the disabled state (i.e., low level).

Figure 5B:
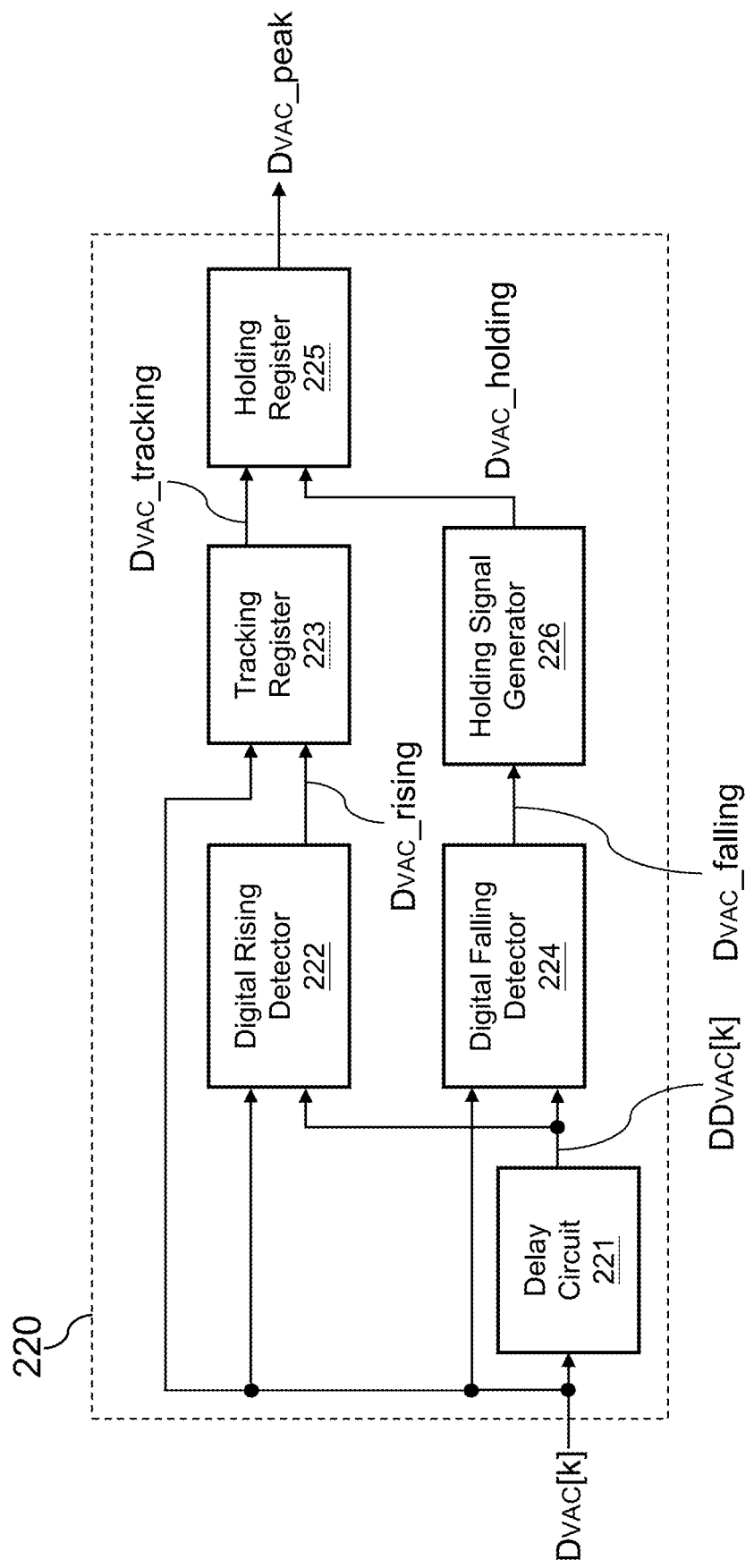
FIG. 5B is a module block diagram of a digital peak-hold circuit according to another embodiment of the present invention.

Please refer to FIG. 5B, which is a module block diagram of the digital peak-hold circuit 220 according to another embodiment of the present invention. As shown in FIG. 5B, in some embodiments, the digital peak-hold circuit 220 further includes a holding signal generator 226, wherein the holding signal generator 226 is coupled between the digital falling detector 224 and the holding register 225. The holding signal generator 226 is configured to generate a holding signal DVAC_holding, and is configured to trigger a pulse of the holding signal DVAC_holding when the falling signal DVAC_falling is switched to the enabled state, wherein the holding register 225 latches the value of the tracking signal DVAC_tracking to generate the value of the peak signal DVAC_peak when the pulse is triggered.

Figure 6A:
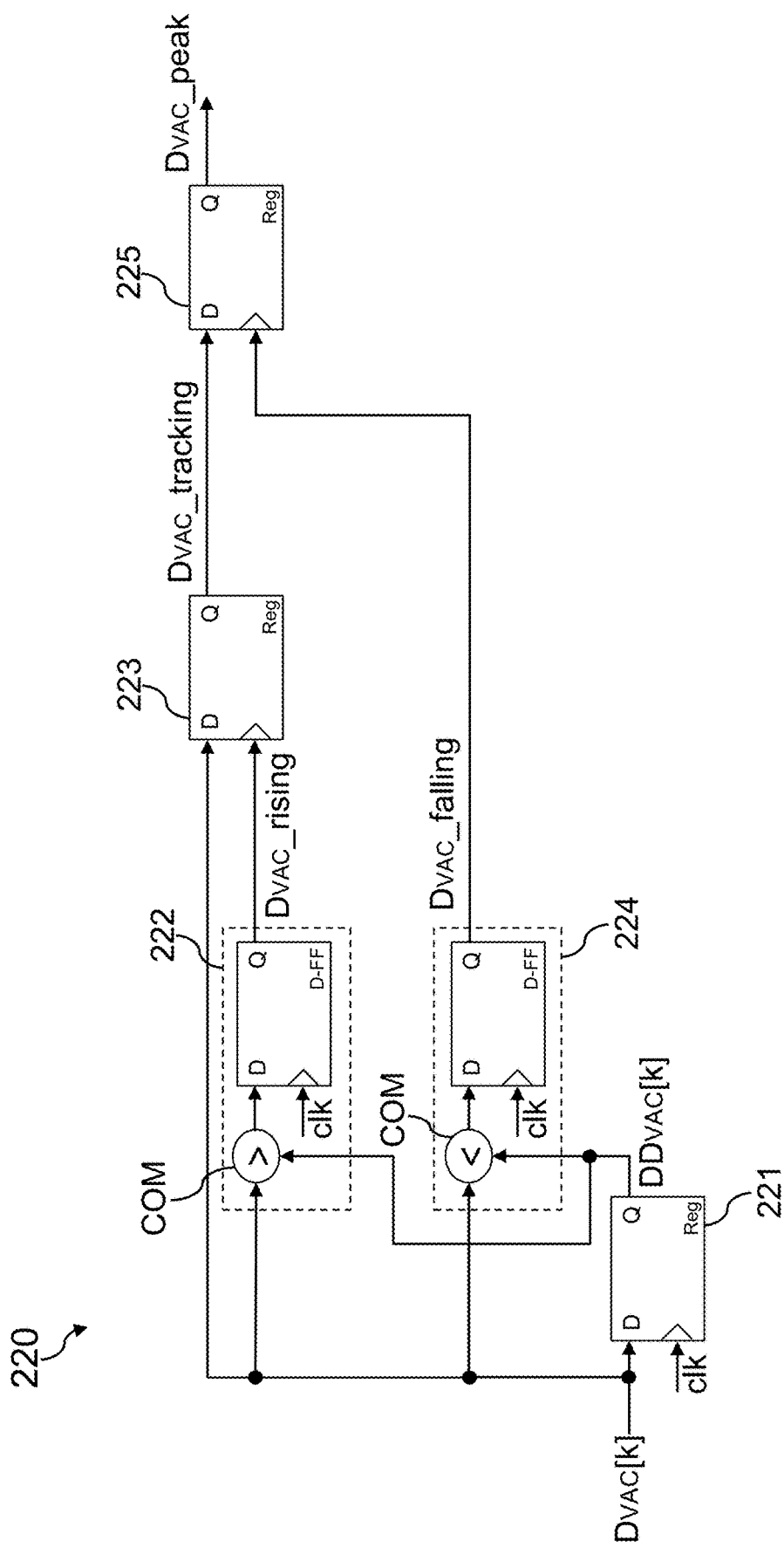
FIG. 6A is a schematic circuit diagram of a digital peak-hold circuit according to an embodiment of the present invention.
Figure 6B:
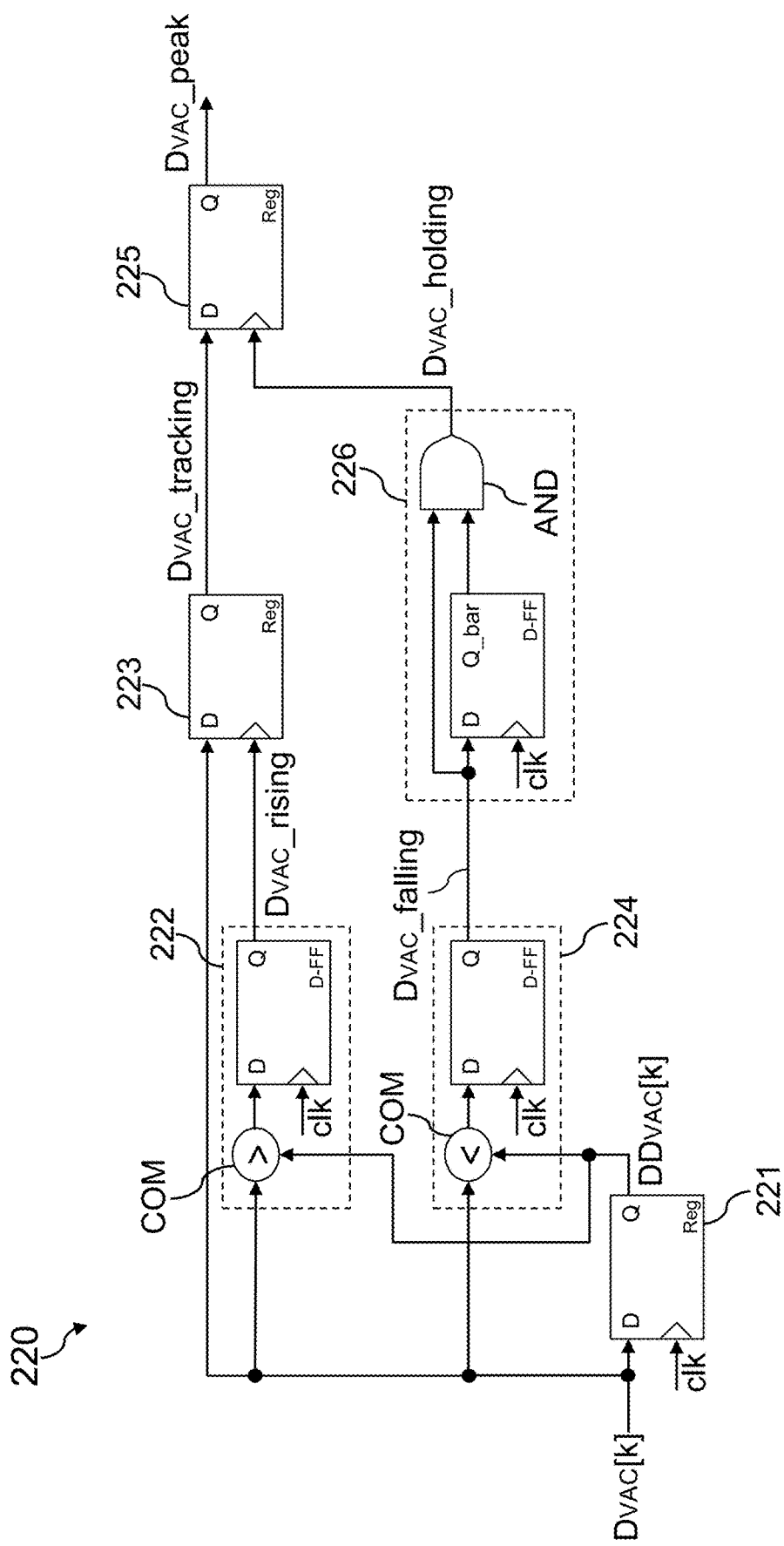
FIG. 6B is a schematic circuit diagram of a digital peak-hold circuit according to another embodiment of the present invention.

Please refer to FIG. 6A and FIG. 6B at same time, FIG. 6A is a schematic circuit diagram of the digital peak-hold circuit 220 according to an embodiment of the present invention, and FIG. 6B is a circuit schematic diagram of the digital peak-hold circuit 220 according to another embodiment of the present invention. As shown in FIG. 6A, in some embodiments, the delay circuit 221 is a register Reg; the digital rising detector 222 includes a comparator COM and a D-type flip-flop D-FF; the tracking register 223 is a register Reg; the digital falling detector 224 includes a comparator COM and a D-type flip-flop D-FF; and the holding register 225 is a register Reg. As shown in FIG. 6B, in some embodiments, the holding signal generator 226 includes a D-type flip-flop D-FF and an AND gate AND.

Figure 7A:
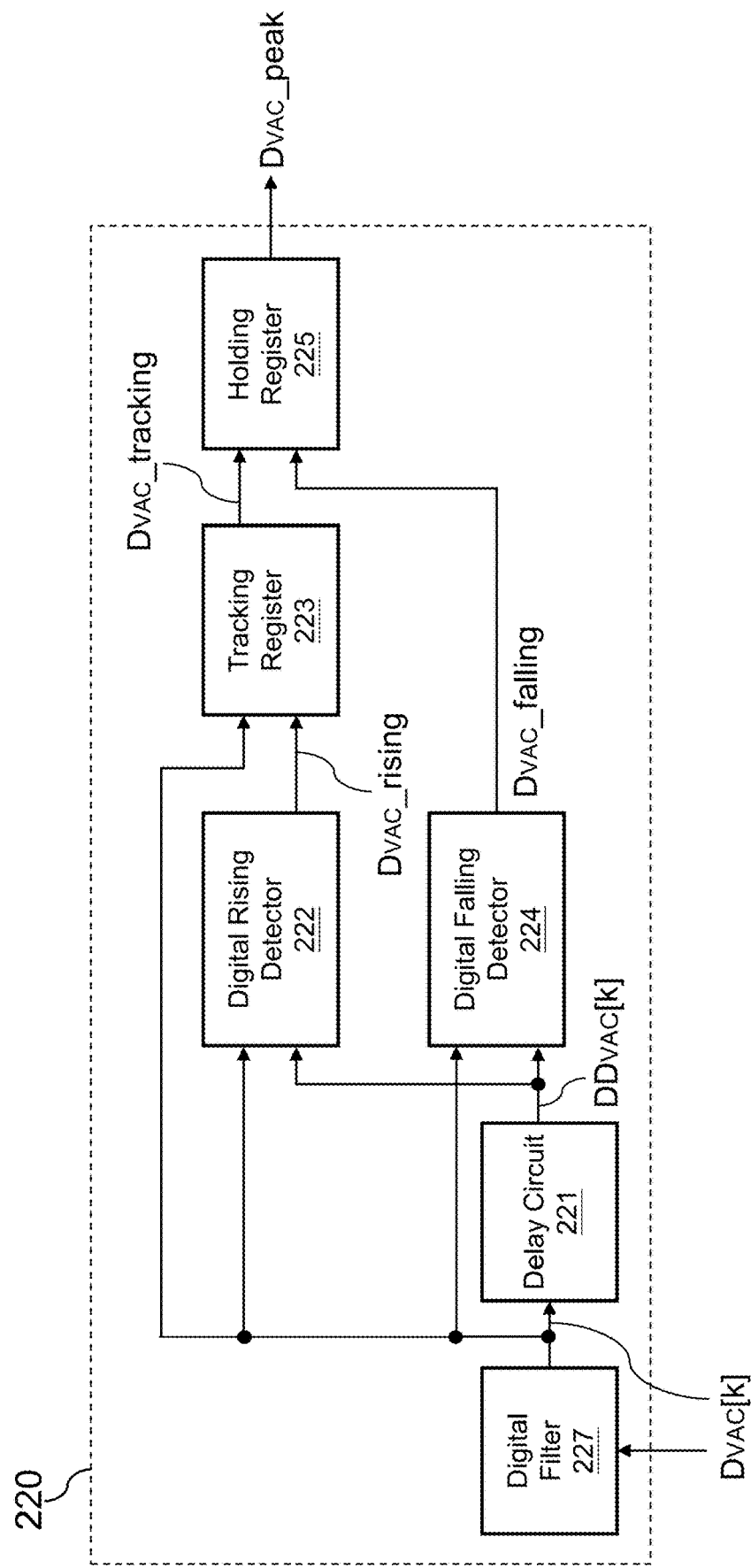
FIG. 7A and FIG. 7B are module block diagrams of the digital peak-hold circuit according to yet two embodiments of the present invention.
Figure 7B:
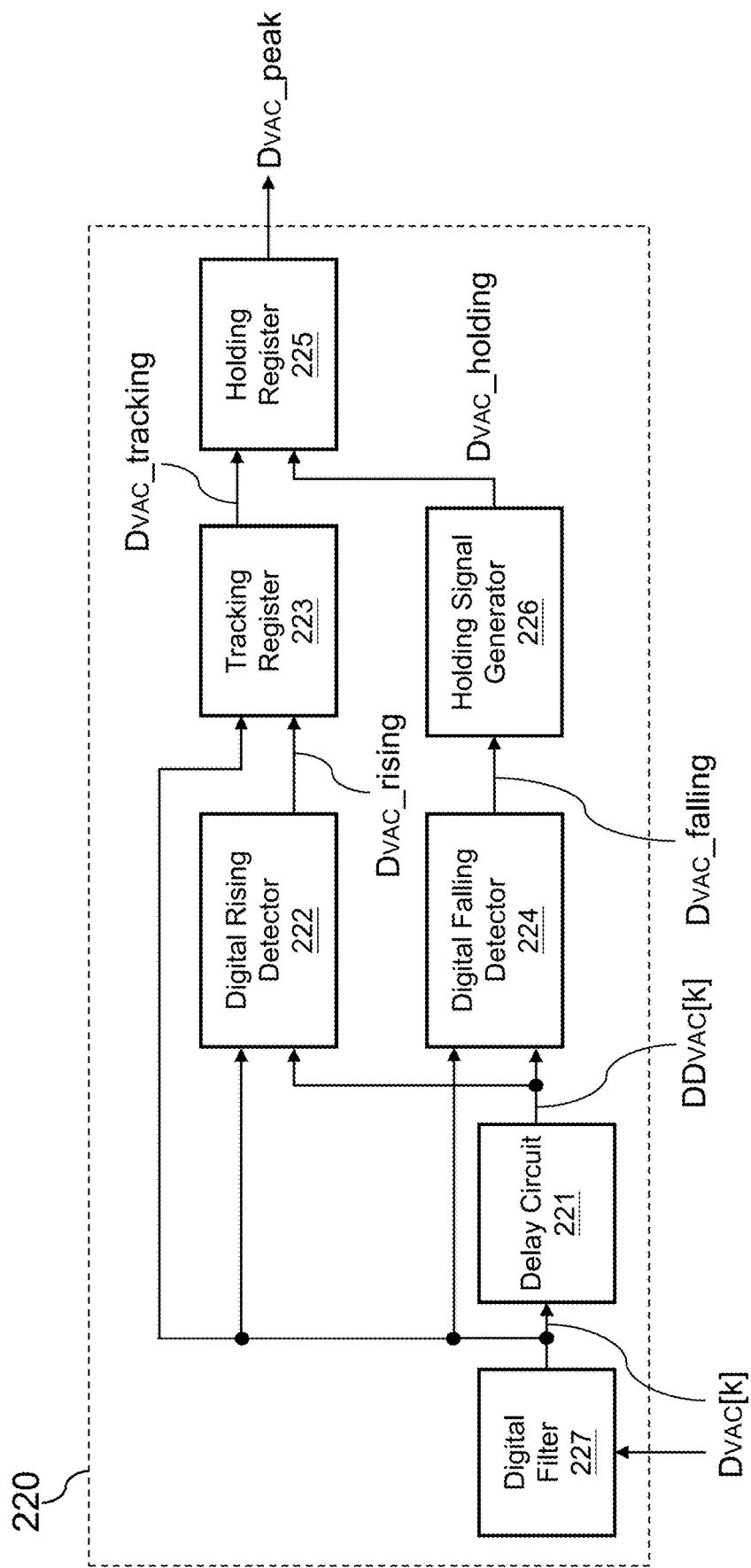

Please refer to FIG. 7A and FIG. 7B. FIGS. 7A and 7B are module block diagrams of the digital peak-hold circuit 220 according to two other embodiments of the present invention. As shown in FIG. 7A and FIG. 7B, in some embodiments, the digital peak-hold circuit 220 further includes a digital filter 227, wherein the digital filter 227 is coupled to the delay circuit 221, the digital rising detector 222, the tracking register 223, and the digital falling detector 224. The digital filter 227 is configured to mask or filter noises in the digital input signal DVAC, so that the value of the digital input signal DVAC monotonically increases or monotonically decreases within ½ period or ¼ period of the digital input signal DVAC, to prevent the digital input signal DVAC from generating a large error value.

In some embodiments, the reference voltage generator 230 is configured to generate a reference voltage Vref according to the peak signal DVAC_peak, wherein the reference voltage Vref is a constant value. Generally, the reference voltage Vref has excellent stability, so that it is not easily affected by noises to cause value changes. Under ideal condition, after the reference voltage Vref is generated, it is maintained at a constant value which will not be changed by any noise or load.

Figure 8A:
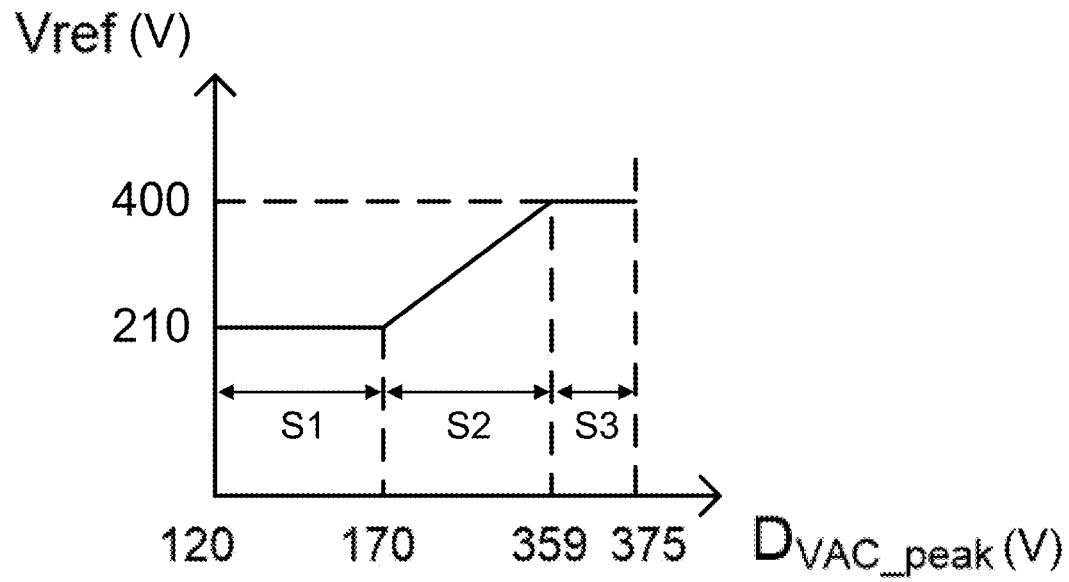
FIG. 8A is a schematic diagram showing mapping relationship between a reference voltage and a peak signal according to an embodiment of the present invention.

In some embodiments, the reference voltage Vref and the peak signal DVAC_peak have a linear or piecewise linear mapping relationship. Please refer to FIG. 8A, which is a schematic diagram of the mapping relationship between the reference voltage Vref and the peak signal DVAC_peak according to an embodiment of the present invention, wherein the horizontal axis of FIG. 8A represents the value of the peak signal DVAC_peak, in unit of volts (V), and the vertical axis of FIG. 8A represents the value of the reference voltage Vref, in unit of volts. As shown in FIG. 8A, there are three segments S1-S3 in the figure. In other words, according to the present embodiment, there is a piecewise linear mapping relationship between the reference voltage Vref and the peak signal DVAC_peak. In segment S1, when the value of the peak signal DVAC_peak ranges from 120 volts to 170 volts, the reference voltage generator 230 maps the value of the reference voltage Vref to 210 volts, wherein 210 volts is a minimum value of the reference voltage Vref according to the present embodiment. In segment S2, when the value of the peak signal DVAC_peak ranges from 170V to 359V, the reference voltage generator 230 linearly maps the value of the reference voltage Vref into a range from 210V to 400V. In segment S3, when the value of the peak signal DVAC_peak ranges from 359 volts to 375 volts, the reference voltage generator 230 maps the value of the reference voltage Vref to 400 volts, wherein 400 volts is a maximum value of the reference voltage Vref according to the present embodiment.

Figure 8B:
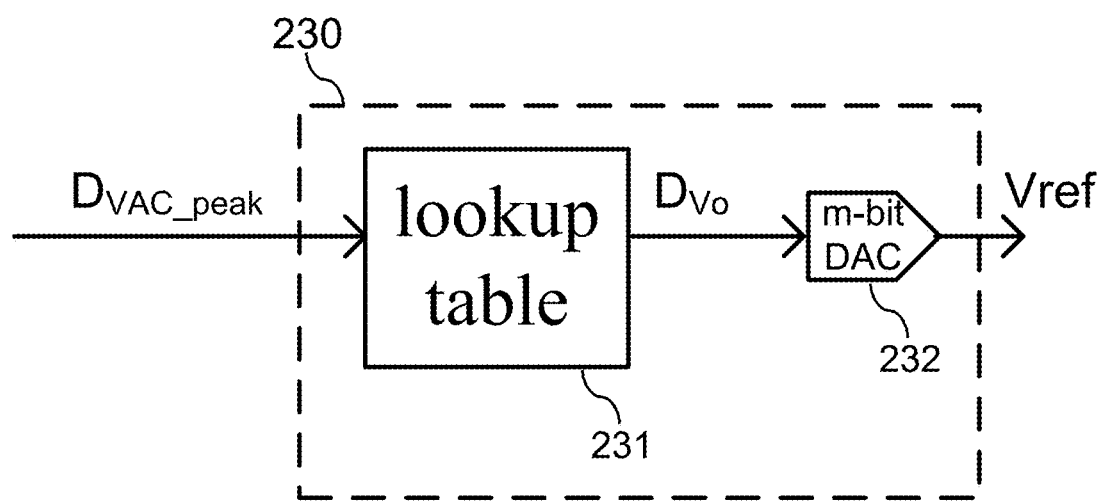
FIG. 8B is a schematic diagram of a reference voltage generator according to an embodiment of the present invention.

Please refer to FIG. 8B, which is a schematic diagram of the reference voltage generator 230 according to an embodiment of the present invention. As shown in FIG. 8B, in some embodiments, the reference voltage generator 230 includes a look-up table 231 and a digital-to-analog converter 232, wherein the look-up table 231 is coupled to the digital-to-analog converter 232. The look-up table 231 is configured to generate a mapping output signal DVo by mapping the peak signal DVAC_peak according to the mapping relationship, and the digital-to-analog converter 232 is configured to convert the mapping output signal DVo into the reference voltage Vref, wherein the mapping output signal DVo is a digital signal and the reference voltage Vref is an analog signal. In some embodiments, the look-up table 231 is a circuit composed of a read only memory (ROM), a random access memory (RAM), a flash memory (Flash), or a combination thereof. The structure and function of the digital-to-analog converter 232 are well known to those skilled in the art to which the present invention pertains, and thus are not redundantly explained in detail herein.

In some embodiments, the error amplifier 240 is configured to generate an error amplified signal VEOA according to a difference between the feedback signal VFB and the reference voltage Vref, wherein the error amplifier 240 has a gain, so that the value of the error amplified signal VEOA is the difference between the feedback signal VFB and the reference voltage Vref multiplied by the gain. For example, assuming that the gain of the error amplifier 240 is 100, then this means that the value of the error amplified signal VEOA is 100 times the difference between the feedback signal VFB and the reference voltage Vref. In some embodiments, the error amplifier 240 has a non-inverting input terminal, an inverting input terminal, and an output terminal, wherein the non-inverting input terminal is configured to receive the reference voltage Vref; the inverting input terminal is configured to receive the feedback signal VFB; and the output terminal is configured to output the error amplified signal VEOA. The structure and function of the error amplifier 240 are well known to those with ordinary knowledge in the technical field to which the present invention pertains, and thus are not redundantly explained in detail herein.

In some embodiments, the pulse-width modulation circuit 250 is configured to perform pulse-width modulation on the error amplified signal VEOA to generate a driving signal DRV. Pulse-width modulation is a technique of converting an analog signal into a pulse signal, wherein when a value of the analog signal is greater than a value of a triangular wave or a value of a sawtooth wave, the pulse-width modulation circuit 250 outputs the driving signal DRV in high level state (for example, 1), and when the value of the analog signal is less than the value of the triangular wave or the value of the sawtooth wave, the pulse-width modulation circuit 250 outputs the drive signal DRV in low level state (for example, 0). The pulse-width modulation technique is well known to those with ordinary knowledge in the technical field to which the present invention pertains, and thus are not redundantly explained in detail herein.

In some embodiments, the power stage circuit 300 is configured to convert the rectified voltage Vi into an output voltage Vo through a switched inductor conversion method, wherein an operation of the power stage circuit 300 is controlled by a driving signal DRV. Since there is a linear or piecewise linear mapping relationship between the reference voltage Vref and the peak signal DVAC_peak, the output voltage Vo corresponding to the reference voltage Vref and the rectified voltage Vi (or AC voltage Vac) corresponding to the peak signal DVAC_peak also have a corresponding linear or piecewise linear mapping relationship. In a circuit application that the present invention is applied to, the output voltage Vo is higher than the rectified voltage Vi.

Figure 9:
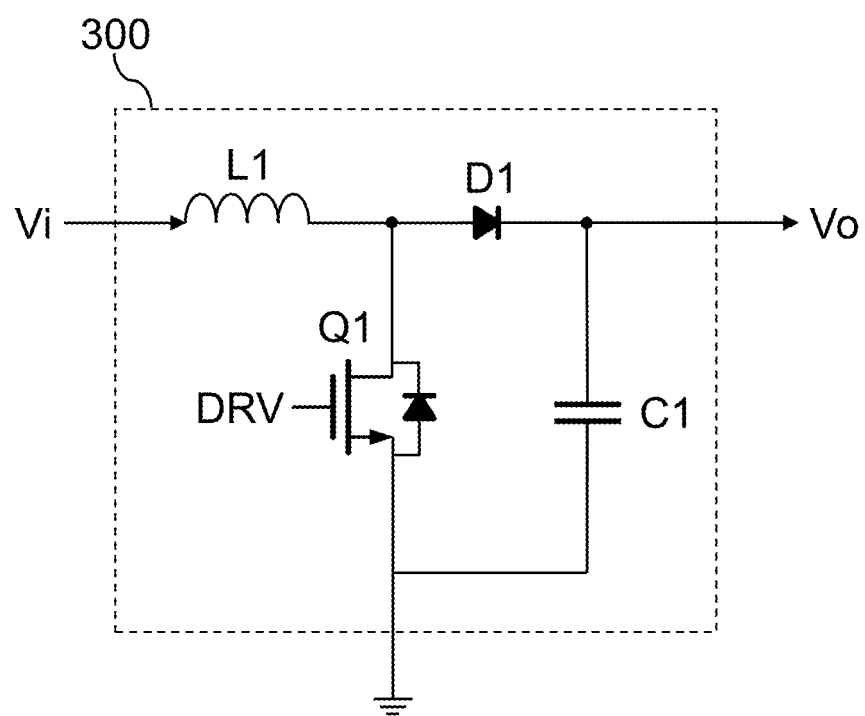
FIG. 9 is a schematic circuit diagram of a power stage circuit according to an embodiment of the present invention.

In some embodiments, the power stage circuit 300 includes at least one inductor, plural switches, and at least one capacitor, wherein the plural switches can be diodes, bipolar transistors (BJTs), or metal oxide semiconductor field effect transistor (MOSFET). Please refer to FIG. 9, which is a schematic circuit diagram of the power stage circuit 300 according to an embodiment of the present invention. As shown in FIG. 9, the power stage circuit 300 is, for example, a boost power stage circuit, and includes, for example, an inductor L1, a diode D1, a transistor Q1, and a capacitor C1, wherein the diode D1 and the transistor Q1 are used as switches. When the driving signal DRV is in high level state, the transistor Q1 is controlled to be in a conducting state and the diode D1 is in a non-conducting state. Meanwhile, the rectified voltage Vi received by the power stage circuit 300 will charge the inductor L1. When the driving signal DRV is in the low level state, the transistor Q1 is controlled to be in the non-conducting state and the diode D1 is in the conducting state. Meanwhile, the rectified voltage Vi received by the power stage circuit 300 will charge the capacitor C1, and at the same time, the inductor L1 also discharges to charge the capacitor C1 to generate the output voltage Vo, so that the output voltage Vo is higher than the rectified voltage Vi.

Figure 10:
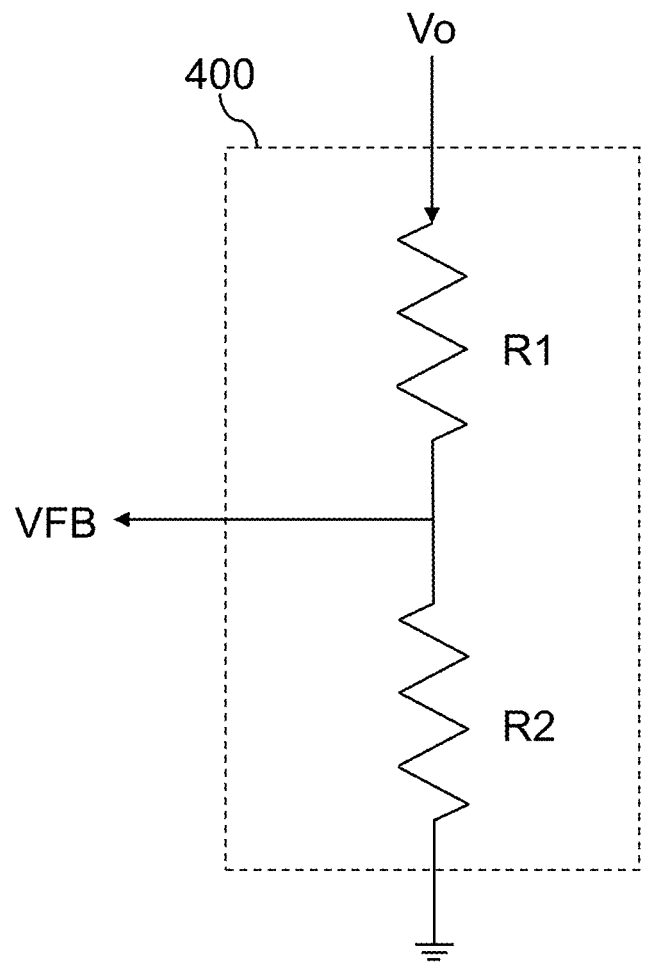
FIG. 10 is a schematic circuit diagram of a feedback circuit according to an embodiment of the present invention.

In some embodiments, the feedback circuit 400 is configured to generate the feedback signal VFB according to the output voltage Vo, wherein there is a proportional relationship between the output voltage Vo and the feedback signal VFB. In some embodiments, the feedback circuit 400 includes a voltage divider circuit formed by plural resistors, wherein the resistances of the resistors define the proportional relationship. Please refer to FIG. 10, FIG. 10 is a schematic circuit diagram of the feedback circuit 400 according to an embodiment of the present invention. As shown in FIG. 10, according to the present embodiment, the feedback circuit 400 includes two resistors R1 and R2, wherein the value of the resistor R1 and the value of the resistor R2 determine the proportional relationship between the output voltage Vo and the feedback signal VFB. For example, when the value of resistor R1 is 4 kiloohms (kΩ) and the value of resistor R2 is 1 kiloohm, the proportional relationship between the output voltage Vo and the feedback signal VFB is 5 to 1, that is, the value of the output voltage Vo is 5 times the value of the feedback signal VFB.

Figure 11A:
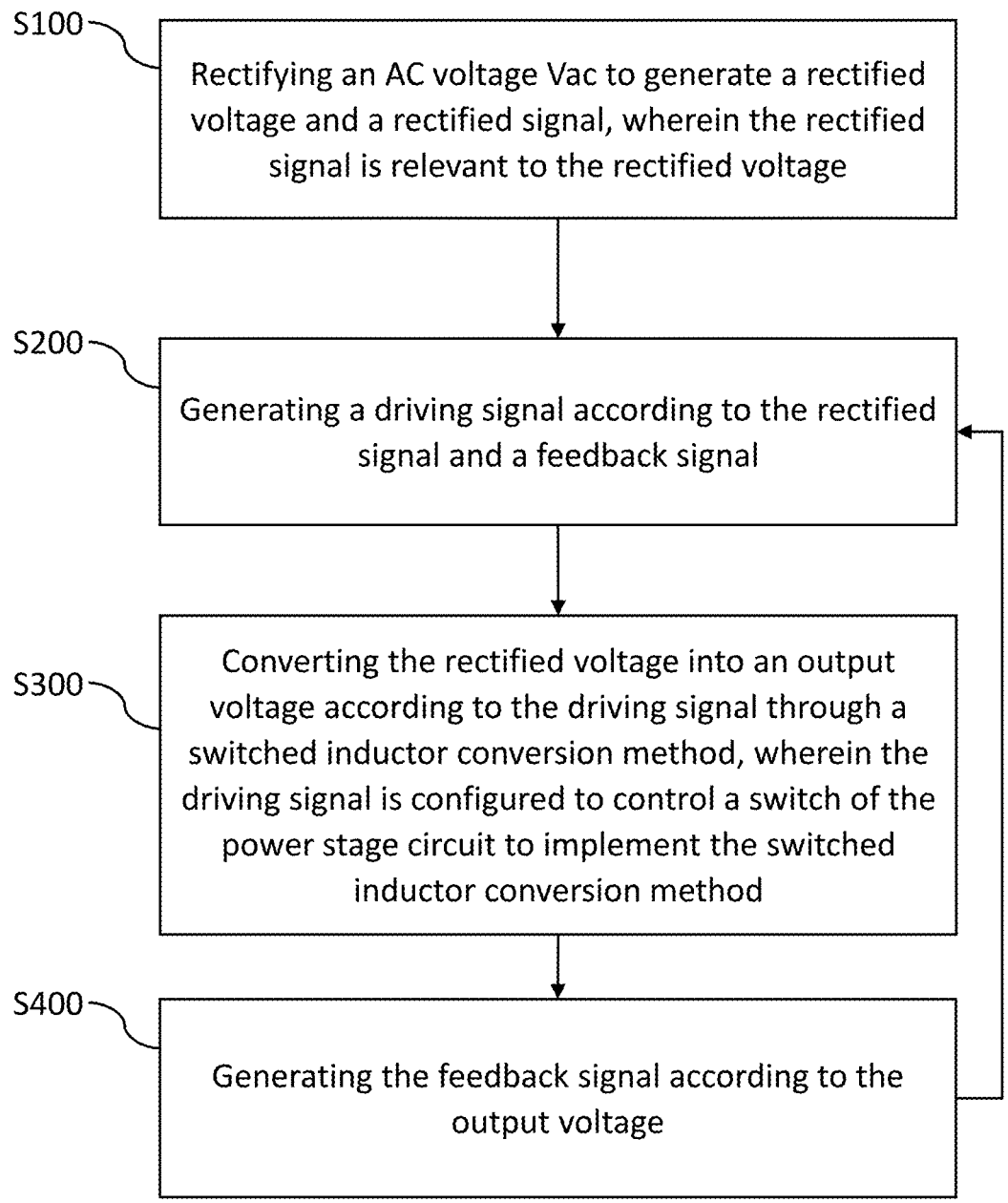
FIG. 11A is a flowchart (1) of a control method of a power factor correction converter according to an embodiment of the present invention.
Figure 11B:
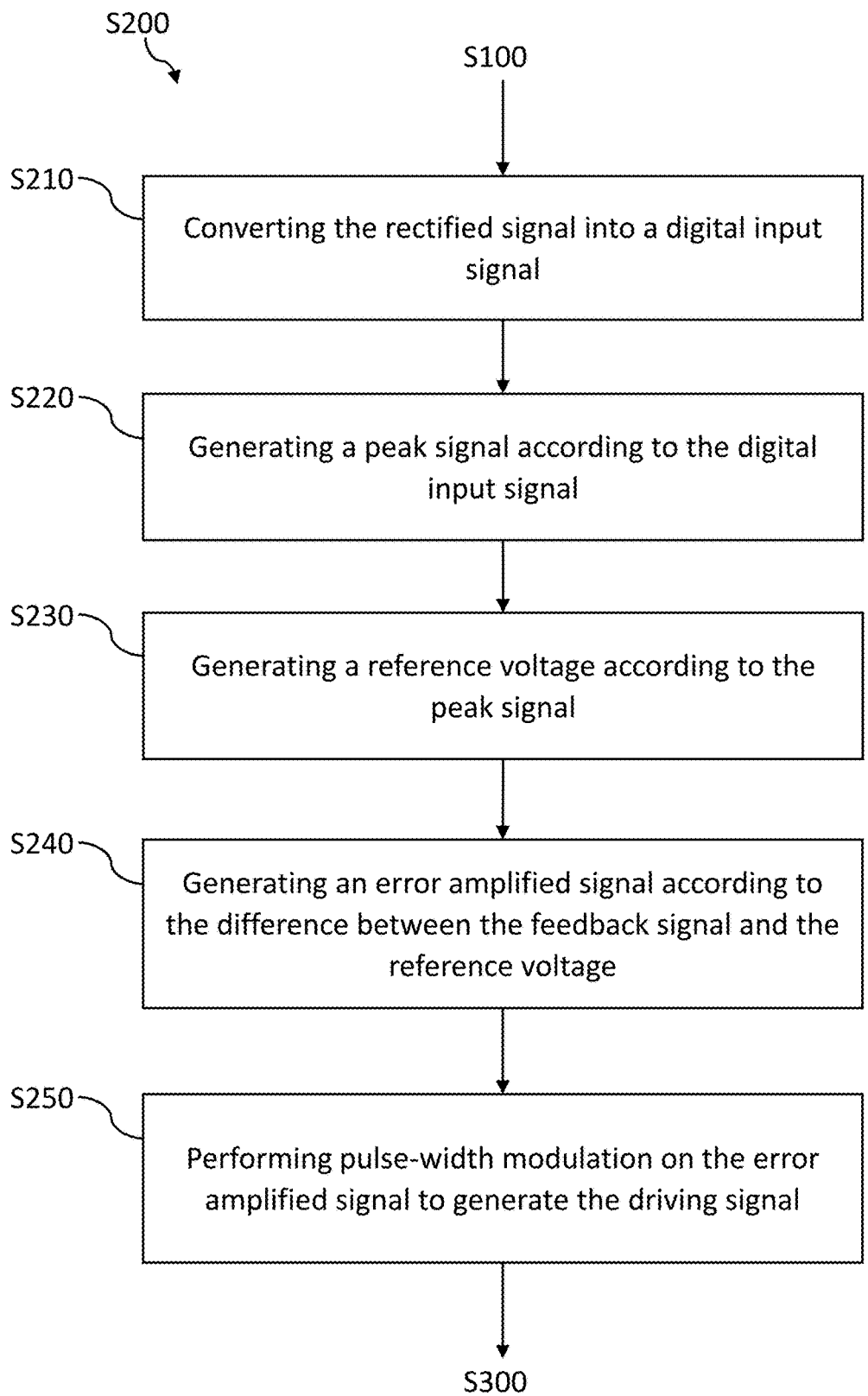
FIG. 11B is a flowchart (2) of the control method of the power factor correction converter according to an embodiment of the present invention.
Figure 11C:
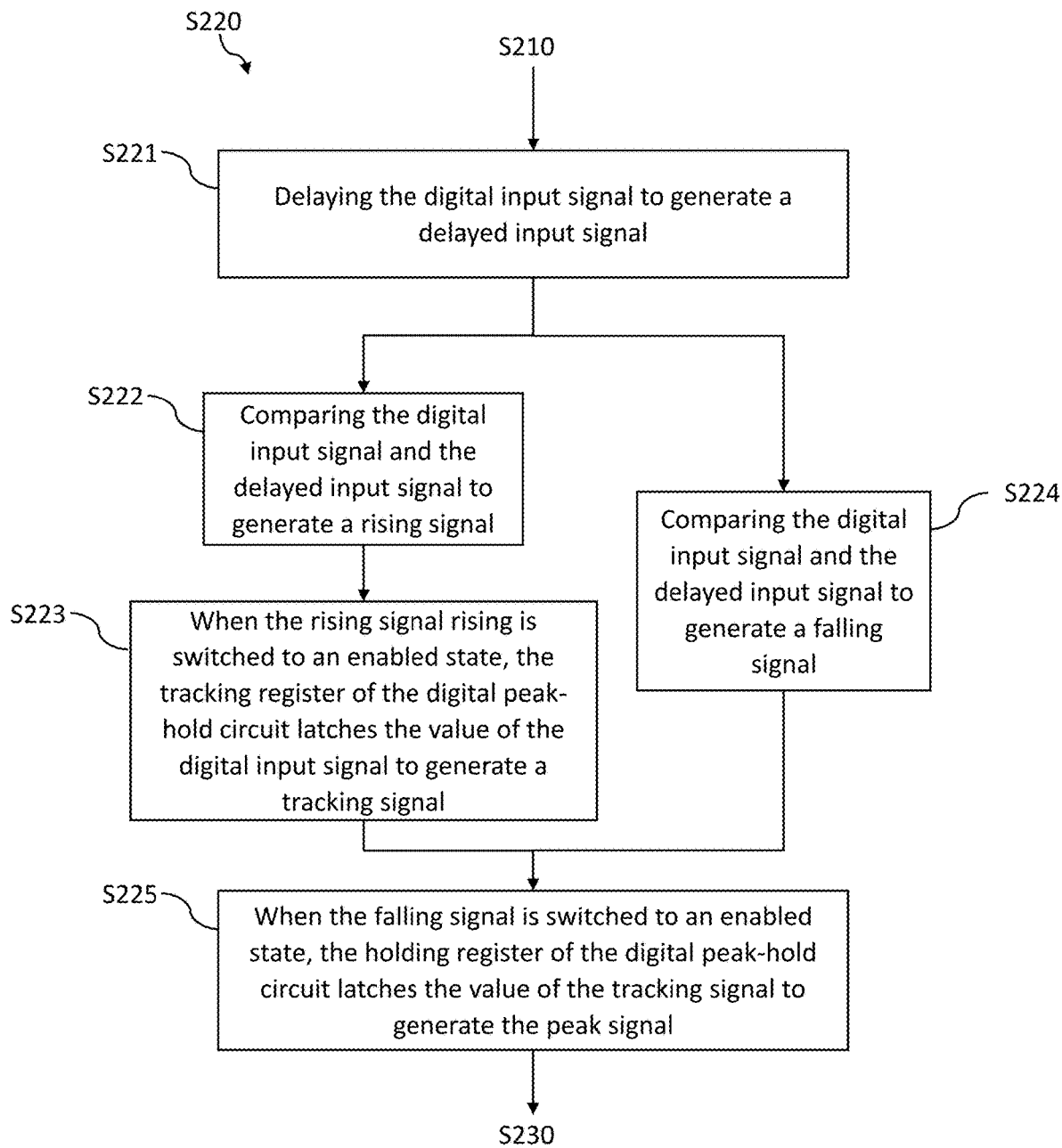
FIG. 11C is a flowchart (3) of the control method of the power factor correction converter according to an embodiment of the present invention.

Please refer to FIGS. 11A to 11C. FIGS. 11A to 11C are flowcharts of a control method of the power factor correction converter 20 according to an embodiment of the present invention. As shown in FIG. 11A, when the power factor correction converter 20 starts to operate, the rectifier 100 of the power factor correction converter 20 rectifies an AC voltage Vac to generate a rectified voltage Vi and a rectified signal VAC, wherein the rectified signal VAC is relevant to the rectified voltage Vi (step S100). Subsequently, the power factor correction controller 200 of the power factor correction converter 20 generates a driving signal DRV according to the rectified signal VAC and a feedback signal VFB (step S200). Subsequently, the power stage circuit 300 of the power factor correction converter 20 converts the rectified voltage Vi into an output voltage Vo according to the driving signal DRV through a switched inductor conversion method, wherein the driving signal DRV is configured to control a switch of the power stage circuit 300 to implement the switched inductor conversion method (step S300). Next, the feedback circuit 400 of the power factor correction converter 20 generates a feedback signal VFB according to the output voltage Vo (step S400). Based on the feedback signal VFB, the power factor correction converter 20 repeats steps S200 to S400.

FIG. 11B is a detailed flow showing how the power factor correction controller 200 generates the driving signal DRV according to the rectified signal VAC and the feedback signal VFB (i.e., detailed flow of step S200). When the power factor correction controller 200 receives the rectified signal VAC and the feedback signal VFB, the analog-to-digital converter 210 of the power factor correction controller 200 converts the rectified signal VAC into a digital input signal DVAC (step S210). Subsequently, the digital peak-hold circuit 220 of the power factor correction controller 200 generates a peak signal DVAC_peak according to the digital input signal DVAC (step S220). Next, the reference voltage generator 230 of the power factor correction controller 200 generates a reference voltage Vref according to the peak signal DVAC_peak (step S230). Meanwhile, the error amplifier 240 of the power factor correction controller 200 generates an error amplified signal VEOA according to the difference between the feedback signal VFB and the reference voltage Vref (step S240). Next, the pulse-width modulation circuit 250 of the power factor correction controller 200 performs pulse-width modulation on the error amplified signal VEOA to generate the driving signal DRV (step S250).

FIG. 11C is a detailed flow showing how the digital peak-hold circuit 220 generates the peak signal DVAC_peak according to the digital input signal DVAC (i.e., detailed flow of step S220). When the digital peak-hold circuit 220 receives the digital input signal DVAC, the delay circuit 221 of the digital peak-hold circuit 220 delays the digital input signal DVAC to generate a delayed input signal DDVAC (step S221). Subsequently, the digital rising detector 222 of the digital peak-hold circuit 220 compares the digital input signal DVAC and the delayed input signal DDVAC to generate a rising signal DVAC_rising (step S222). When the rising signal DVAC_rising is switched to an enabled state, the tracking register 223 of the digital peak-hold circuit 220 latches the value of the digital input signal DVAC to generate a tracking signal DVAC_tracking (step S223). Meanwhile, the digital falling detector 224 of the digital peak-hold circuit 220 compares the digital input signal DVAC and the delayed input signal DDVAC to generate a falling signal DVAC_falling (step S224). Next, when the falling signal DVAC_falling is switched to the enabled state, the holding register 225 of the digital peak-hold circuit 220 latches the value of the tracking signal DVAC_tracking to generate the peak signal DVAC_peak (step S225).

Figure 12:
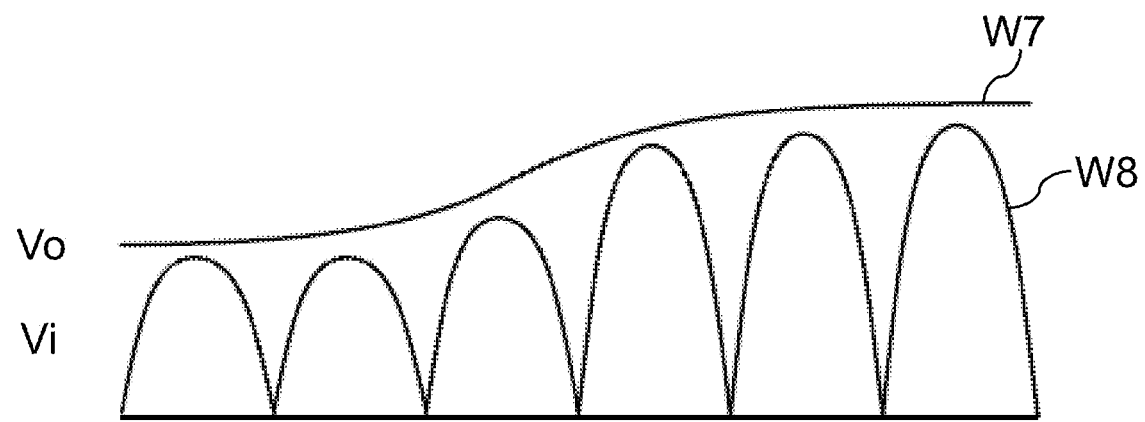
FIG. 12 is a waveform comparison diagram between a rectified voltage and an output voltage in the power factor correction converter according to an embodiment of the present invention.

Please refer to FIG. 12, which is a waveform comparison diagram between the rectified voltage Vi and the output voltage Vo of the power factor correction converter 20 according to an embodiment of the present invention, wherein the waveform W7 is a waveform of the output voltage Vo, and the waveform W8 is a waveform of the rectified voltage Vi. As shown in FIG. 12, since the value of the output voltage Vo outputted by the power factor correction converter 20 varies along with the peak of the rectified voltage Vi (that is, the waveform W7 varies along with the peak of waveform W8), the difference between the output voltage Vo and the rectified voltage Vi is not large. Therefore, the power factor correction converter 20 of the present embodiment can use smaller-sized energy storage devices and switches, so as to reduce the circuit size, cost, and overall power consumption during operation of the power factor correction converter 20.

Figure 1A:
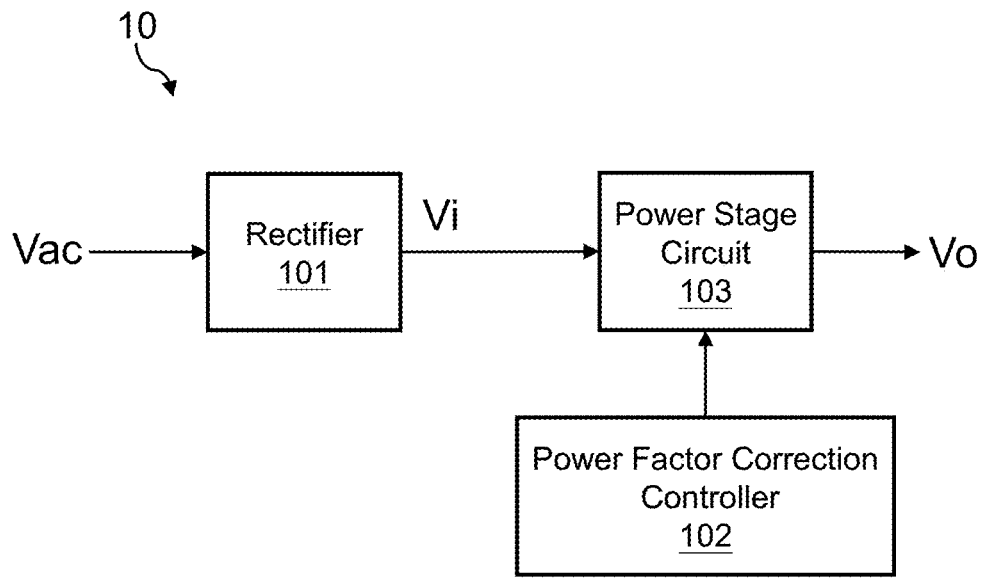
FIG. 1A is a module block diagram of a power factor correction converter according to a conventional art.
Figure 1B:
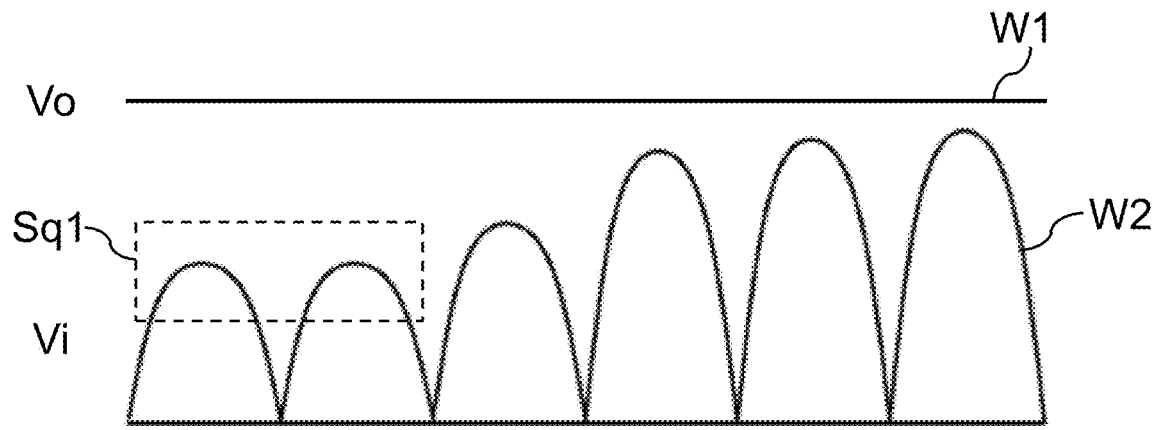
FIG. 1B is a waveform comparison diagram between a rectified voltage and an output voltage in the power factor correction converter according to the conventional art.

In summary, because the power factor correction controller 200 of the present invention includes the digital peak-hold circuit 220, the reference voltage Vref of the present invention is limited within a range, and the value of the output voltage Vo outputted by the power factor correction converter 20 varies along with the peak of the rectified voltage Vi to reduce the voltage difference therebetween. Therefore, compared with the conventional art of FIG. 1A and FIG. 1B, the power factor correction converter 20 of the present invention has the advantages of smaller circuit size, cost, and overall power consumption during operation. In addition, because the power factor correction converter 20 of the present invention is provided with the feedback circuit 400, the power factor correction converter 20 of the present invention has the advantage of a stable output voltage Vo.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A digital peak-hold circuit configured to generate a peak signal according to a digital input signal, comprising:
   a delay circuit, configured to delay the digital input signal to generate a delayed input signal, wherein the delayed input signal is delayed by at least one clock period of the digital input signal;
   a digital rising detector, configured to compare the digital input signal and the delayed input signal to generate a rising signal, wherein when the digital input signal is greater than the delayed input signal, the digital rising detector controls the rising signal to be in a first enabled state;
   a tracking register, configured to latch a value of the digital input signal to generate a tracking signal when the rising signal is in the first enabled state;
   a digital falling detector, configured to compare the digital input signal and the delayed input signal to generate a falling signal, wherein when the digital input signal is less than the delayed input signal, the digital falling detector controls the falling signal to be in a second enabled state; and
   a holding register, configured to latch a value of the tracking signal to generate the peak signal when the falling signal is switched to the second enabled state.

2. The digital peak-hold circuit of claim 1, wherein when the tracking register receives a reset signal, the tracking register sets the tracking signal to a reset value, wherein an initial value of the tracking signal is the reset value; and/or when the holding register receives another reset signal, the holding register sets the peak signal to another reset value, wherein an initial value of the peak signal is the another reset value.

3. The digital peak-hold circuit of claim 1, further comprising a holding signal generator configured to generate a holding signal, the holding signal generator being configured to trigger a pulse of the holding signal when the falling signal is switched to the second enabled state, wherein the holding register latches the value of the tracking signal to generate the peak signal when the pulse is triggered.

4. The digital peak-hold circuit of claim 1, further comprising a digital filter configured to mask or filter a noise of the digital input signal, so that the value of the digital input signal monotonically increases or monotonically decreases within ½ period or ¼ period of the digital input signal.

5. The digital peak-hold circuit of claim 1, which is employed in a power factor correction converter, wherein the power factor correction converter comprises:
   a rectifier, configured to rectify an alternating current voltage to generate a rectified voltage;
   a power stage circuit, comprising at least one switch and an inductor, configured to convert the rectified voltage into an output voltage through a switched inductor conversion method;
   a feedback circuit, configured to generate a feedback signal according to the output voltage;
   an analog-to-digital converter, configured to convert a rectified signal into the digital input signal, wherein the rectified signal is relevant to the rectified voltage;
   a reference voltage generator, configured to generate a reference voltage according to the peak signal;
   an error amplifier, configured to generate an error amplified signal according to a difference between the feedback signal and the reference voltage; and
   a pulse-width modulation circuit, configured to perform pulse-width modulation on the error amplified signal to generate a driving signal, wherein the driving signal is configured to control the at least one switch.

6. The digital peak-hold circuit of claim 5, wherein the rectified signal has a full-wave rectification form or a half-wave rectification form.

7. The digital peak-hold circuit of claim 5, wherein a mapping relationship which is linear or piecewise linear is set between the reference voltage and the peak signal, such that the output voltage and a value of the rectified voltage corresponding to the peak signal have another mapping relationship in between and the another mapping relationship is correspondingly linear or correspondingly piecewise linear, wherein the output voltage is always greater than the value of the rectified voltage corresponding to the peak signal.

8. The digital peak-hold circuit of claim 7, wherein the reference voltage generator comprises:
   a look-up table, configured to generate a mapping output signal by mapping the peak signal according to the mapping relationship; and a digital-to-analog converter, configured to convert the mapping output signal into the reference voltage, wherein the mapping output signal is a digital signal and the reference voltage is an analog signal.

9. The digital peak-hold circuit of claim 8, wherein the look-up table comprises a read only memory (ROM), a random access memory (RAM), a flash memory (Flash), or a combination thereof.

10. A power factor correction controller, suitable for a power factor correction converter, configured to generate a driving signal according to a rectified signal and a feedback signal, comprising:
an analog-to-digital converter, configured to convert a rectified signal into a digital input signal;
a digital peak-hold circuit, configured to generate a peak signal according to the digital input signal, the digital peak-hold circuit comprising:
a delay circuit, configured to delay the digital input signal to generate a delayed input signal, wherein the delayed input signal is delayed by at least one clock period of the digital input signal;
a digital rising detector, configured to compare the digital input signal and the delayed input signal to generate a rising signal, wherein when the digital input signal is greater than the delayed input signal, the digital rising detector controls the rising signal to be in a first enabled state;
a tracking register, configured to latch a value of the digital input signal to generate a tracking signal when the rising signal is switched to the first enabled state;
a digital falling detector, configured to compare the digital input signal and the delayed input signal to generate a falling signal, wherein when the digital input signal is less than the delayed input signal, the digital falling detector controls the falling signal to be in a second enabled state;
a holding register, configured to latch a value of the tracking signal to generate the peak signal when the falling signal is switched to the second enabled state;
a reference voltage generator, configured to generate a reference voltage according to the peak signal;
an error amplifier, configured to generate an error amplified signal according to a difference between the feedback signal and the reference voltage; and
a pulse-width modulation circuit, configured to perform pulse-width modulation on the error amplified signal to generate a driving signal, wherein the driving signal is configured to control at least one switch.

11. The power factor correction controller of claim 10, wherein the rectified signal has a full-wave rectification form or a half-wave rectification form.

12. The power factor correction controller of claim 10, wherein a mapping relationship which is linear or piecewise linear is set between the reference voltage and the peak signal, such that the output voltage and a value of the rectified voltage corresponding to the peak signal have another mapping relationship in between and the another mapping relationship is correspondingly linear or correspondingly piecewise linear, wherein the output voltage is always greater than the value of the rectified voltage corresponding to the peak signal.

13. The power factor correction controller of claim 12, wherein the reference voltage generator comprises:
a look-up table, configured to generate a mapping output signal by mapping the peak signal according to the mapping relationship; and
a digital-to-analog converter, configured to convert the mapping output signal into the reference voltage, wherein the mapping output signal is a digital signal and the reference voltage is an analog signal.

14. The power factor correction controller of claim 13, wherein the look-up table comprises a read only memory (ROM), a random access memory (RAM), a flash memory (Flash), or a combination thereof.

15. A power factor correction converter, configured to convert an alternating current voltage into an output voltage, comprising:
a rectifier, configured to rectify an alternating current voltage to generate a rectified voltage;
a power factor correction controller, configured to generate a driving signal according to a rectified signal and a feedback signal, wherein the rectified signal is relevant to the rectified voltage, and the power factor correction controller comprises:
an analog-to-digital converter, configured to convert the rectified signal into a digital input signal;
a digital peak-hold circuit, configured to generate a peak signal according to the digital input signal, the digital peak-hold circuit comprising:
a delay circuit, configured to delay the digital input signal to generate a delayed input signal, wherein the delayed input signal is delayed by at least one clock period of the digital input signal;
a digital rising detector, configured to compare the digital input signal and the delayed input signal to generate a rising signal, wherein when the digital input signal is greater than the delayed input signal, the digital rising detector controls the rising signal to be in a first enabled state;
a tracking register, configured to latch a value of the digital input signal to generate a tracking signal when the rising signal is in the first enabled state;
a digital falling detector, configured to compare the digital input signal and the delayed input signal to generate a falling signal, wherein when the digital input signal is less than the delayed input signal, the digital falling detector controls the falling signal to be in a second enabled state;
a holding register, configured to latch a value of the tracking signal to generate the peak signal when the falling signal is switched to the second enabled state;
a reference voltage generator, configured to generate a reference voltage according to the peak signal;
an error amplifier, configured to generate an error amplified signal according to a difference between the feedback signal and the reference voltage; and
a pulse-width modulation circuit, configured to perform pulse-width modulation on the error amplified signal to generate a driving signal, wherein the driving signal is configured to control the switch;
a power stage circuit, comprising at least one switch and an inductor, configured to convert the rectified voltage into the output voltage through a switched inductor conversion method; and
a feedback circuit, configured to generate the feedback signal according to the output voltage.

16. The power factor correction converter of claim 15, wherein the rectified signal has a full-wave rectification form or a half-wave rectification form.

17. The power factor correction converter of claim 15, wherein a mapping relationship which is linear or piecewise linear is set between the reference voltage and the peak signal, such that the output voltage and a value of the rectified voltage corresponding to the peak signal have another mapping relationship in between and the another mapping relationship is correspondingly linear or correspondingly piecewise linear, wherein the output voltage is always greater than the value of the rectified voltage corresponding to the peak signal.

18. The power factor correction converter of claim 17, wherein the reference voltage generator comprises:
   a look-up table, configured to generate a mapping output signal by mapping the peak signal according to the mapping relationship; and
   a digital-to-analog converter, configured to convert the mapping output signal into the reference voltage, wherein the mapping output signal is a digital signal and the reference voltage is an analog signal.

19. The power factor correction converter of claim 18, wherein the look-up table comprises a read only memory (ROM), a random access memory (RAM), a flash memory (Flash), or a combination thereof.

\* \* \* \* \*